United States Patent [19]
Tomita et al.

[11] Patent Number: 5,876,245
[45] Date of Patent: Mar. 2, 1999

[54] CIRCUIT BOARD ELECTRICAL CONNECTOR

[75] Inventors: Mitsuhiro Tomita; Shigehiro Morita; Jun Matsukawa, all of Tokyo, Japan

[73] Assignee: Hirose Electric Co., Ltd., Tokyo, Japan

[21] Appl. No.: 612,067

[22] Filed: Mar. 7, 1996

[30] Foreign Application Priority Data

Apr. 7, 1995 [JP] Japan .................................. 7-107083

[51] Int. Cl.⁶ ............................................. H01R 13/62
[52] U.S. Cl. ............................................. 439/540.1
[58] Field of Search ............................ 439/540.1, 326, 439/71–2

[56] References Cited

U.S. PATENT DOCUMENTS 5,062,802  11/1991  Grabbe ............................ 439/72

*Primary Examiner*—Khiem Nguyen
*Assistant Examiner*—Eugene G. Byrd
*Attorney, Agent, or Firm*—Kanesaka & Takeuchi

[57] ABSTRACT

A circuit board electrical connector includes a plurality of multicontact connectors (1) to be mounted on a circuit board with a predetermined interval; a plurality of linking members (6) for joining the multicontact connectors with the predetermined interval before the multicontact connectors are mounted on the circuit board; and linking devices (7–10) for removably linking the multicontact connectors to the linking members.

6 Claims, 10 Drawing Sheets

CIRCUIT BOARD ELECTRICAL CONNECTOR

BACKGROUND OF THE INVENTION

1. Field of the Invention

The present invention relates to circuit board electrical connectors and, especially, to multicontact connectors to be mounted on a circuit board with predetermined intervals.

2. Description of the Related Art

As electronic equipment becomes complicated, the number of contact elements in electrical connectors increases. As a result, the number of contact elements in conventional multicontact connectors can be too small or, even when the number of contact elements is satisfactory, the connector can be too long in a given space, forcing the use of a plurality of shorter multicontact connectors. Sometimes, a plurality of multicontact connectors are mounted on two circuit boards to connect these circuit boards together. In such a case, it is necessary that the relative positions of the multicontact connectors on the respective circuit boards match each other. To achieve this very difficult goal, it has been proposed to use a circuit board connector 50 as shown in FIG. 13, which includes two multicontact connector sections 51 and 52 and linking sections 53 and 54 for coupling them with Et predetermined interval. Such a female type connector 50 is mounted on a circuit board while a similar but male type connector is mounted on another circuit board to connect: these two circuit boards together.

The circuit board connector wherein a plurality of multicontact connectors are integrated with linking sections requires a special metal mold, which is very expensive.

When it is required to mount electronic components on a circuit board with high density, the conventional connector 50 blocks electronic components from being mounted on the areas covered by the linking sections 53 and 54, thus failing to meet the high density mounting requirement.

When the interval between multicontact connectors 51 and 52 is changed or when the number of contact elements in one connector is different from that of the other, it is necessary to make a new metal mold for each design change.

SUMMARY OF THE INVENTION

Accordingly, it is an object of the invention to provide a circuit board electrical connector for maximizing the area on which other electronic components can be mounted.

It is another object to provide a circuit board electrical connector for minimizing the mold costs upon design change.

According to the invention there is provided a circuit board electrical connector which includes a plurality of multicontact connectors; a plurality of linking members for joining the multicontact connectors with a predetermined interval before the connectors are mounted on a circuit board; and linking devices for removably connecting the multicontact connectors to the linking members.

The multicontact connectors are provided with stepped portions on the top of the housings while the opposite ends of the linking members are placed on the stepped portions and connected to the multicontact connectors with the linking devices. It is preferred that the thickness of the linking members is such that the linking members, when connected, do not exceed the highest level of the housings.

It is also preferred that the linking devices include at least one reference surface to define the interval between the connected multicontact connectors.

The linking devices include at least one rectangular aperture provided in either the elongated housing of a multicontact connector or opposite ends of the linking members and at least one projection member provided on either the opposite ends of the linking members or the elongated housing for fitting in the rectangular aperture.

The projection members include a rigid column projection and a resilient projection opposed to the column projection. A surface of the column projections and a surface of the rectangular apertures opposed to the surface of the column projections constitute reference surfaces. When the resilient projections are inserted into the rectangular apertures, they are flexed to exert pressures on the reference surfaces.

It is preferred that two pairs of projection members are provided such that the reference surfaces of each pair extend at right angles.

Preferably, the resilient projections undergo plastic deformation under heat.

After the circuit board electrical connector is mounted on a circuit board, the linking members are removed to provide a space on which other electronic components are mountable.

When the linking members do not exceed the highest level of the elongated housing mounted on a circuit board, it is possible to dispose closely another circuit board in parallel to the circuit board.

When the linking devices include the reference surfaces, it is possible to define accurately the relative positions of multicontact connectors.

When the linking devices include a rectangular aperture provided in the elongated housing or the linking member and a projection member provided on linking member or the elongated housing, merely by pushing the projection member into the rectangular aperture, the multicontact connectors are coupled with a predetermined interval. After mounted on a circuit board, the linking devices can be removed by pulling the projection member from the rectangular aperture.

Where the projection member includes a column projection with a reference surface and an opposed resilient projection, when the projection member is inserted into the rectangular aperture, the resilient projection is flexed to push the reference surface of the column projection against the reference surface of the rectangular aperture thereby providing accurate positioning.

When the reference surfaces of two pairs of projection members are at right angles to each other, it is possible to provide positioning in two directions at right angles.

When the resilient projections are made of a material that undergos plastic deformation, the resilient projections undergo plastic deformation under the heat caused by the reflow process, for example, for mounting the electrical connector on a circuit board so that the linking members can be removed without difficulty.

The above and other objects, features, and advantages of the invention will be more apparent from the following description when taken in conjuntion with the accompanying drawings.

DESCRIPTION OF THE PREFERRED EMBODIMENT

Embodiments of the invention will be described below with reference to the accompanying drawings.

Figure 1:
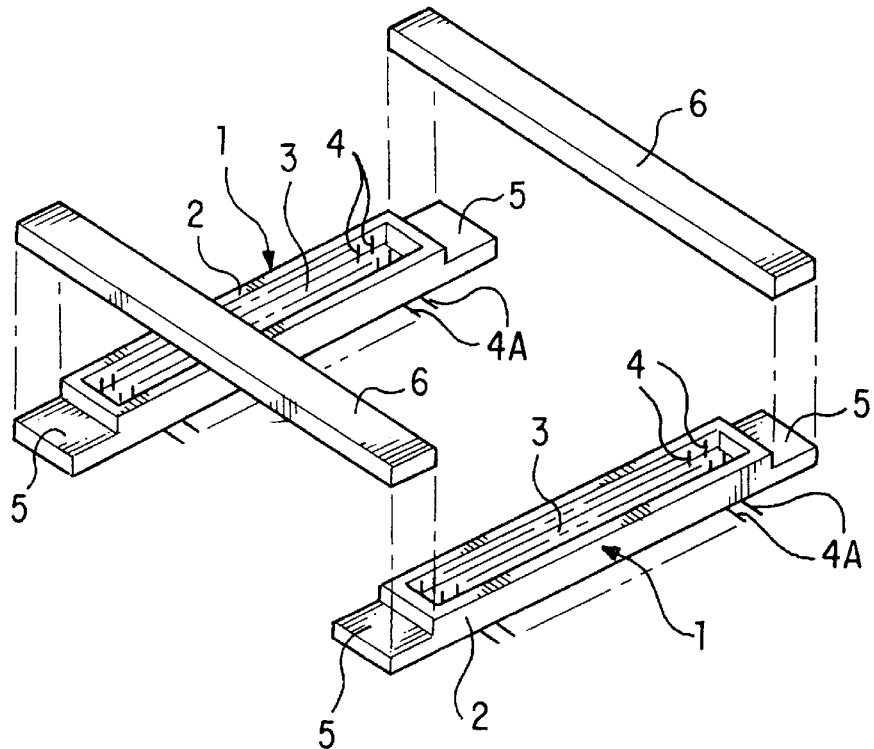
FIG. 1 is an exploded perspective view of circuit board electrical connectors and linking members according to an embodiment of the invention.
Figure 2:
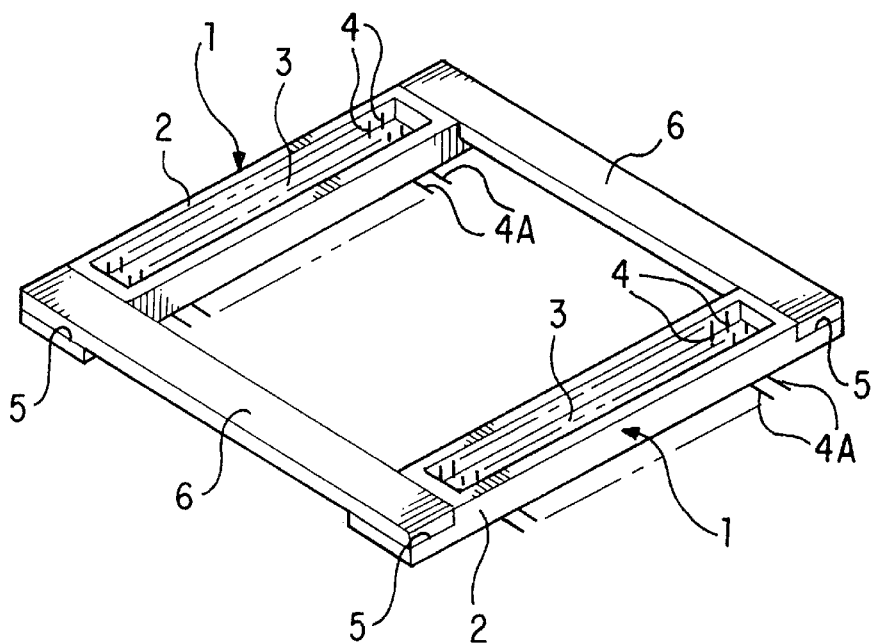
FIG. 2 is a perspective view of the connectors joined together with the linking members.

FIGS. 1 and 2 show multicontact connectors and linking members separated from and joined to the multicontact connectors, respectively.

There are provided two identical female type multicontact connectors 1 including a housing 2 with a receiving recess 3 opening upwardly for receiving a male type multicontact connector (FIG. 7) such that contact elements 4 are brought into contact with contact elements of the mating connector. The contact elements 4 have a connection portion 4A extending laterally from the bottom of the housing 2 so as to be brought into contact with a conductor of a circuit board when the multicontact connectors 1 are placed on the circuit board (not shown).

A pair of stepped portions 5 are provided on opposite ends of the elongated housing 2. A pair of linking members 6 joins the stepped end portions 2 of a pair of the elongated housing 2. It is preferred that the depth of the stepped portions 5 is such that the linking members 6 do not exceed the highest level of the elongated housing 2 so that the height of the connector is controlled not to influence the space between circuit boards.

Figure 3:
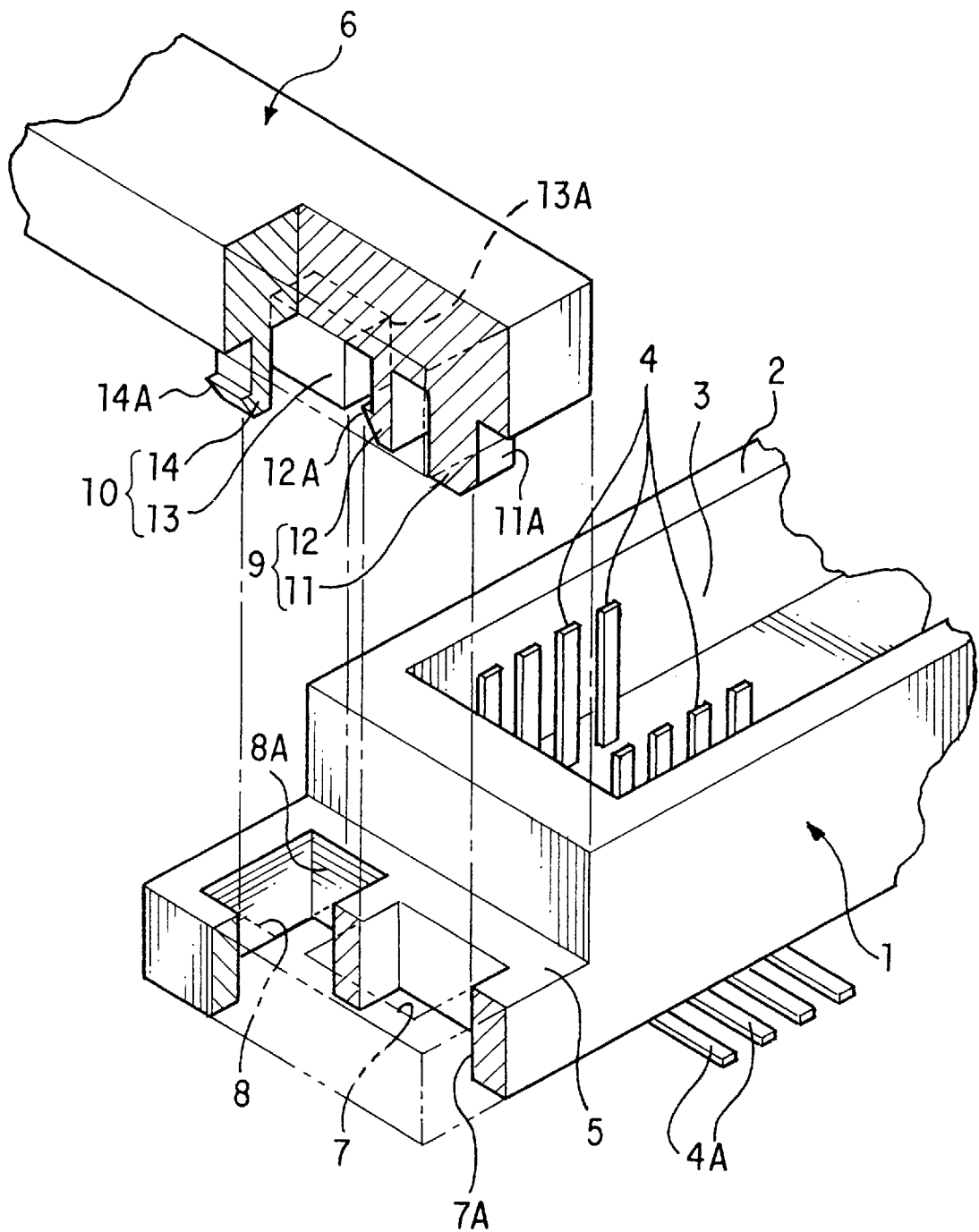
FIG. 3 is a partially cutaway perspective view of a linking portion of the connector.

In FIG. 3, two rectangular apertures 7 and 8 are provided in the stepped portion 5. Flat reference surfaces 7A and 8A are provided on the rectangular apertures 7 and 8, respectively, such that they are perpendicular to each other. The reference surfaces 7A and 8A are provided at predetermined positions with respect to the contact elements 4 and the receiving recess 3.

A pair of projection members 9 and 10 extends downwardly from each end of the linking member 6. Each projection member 9 or 10 includes a column projection 11 or 13 and a resilient projection 12 or 14. The column projections 11 and 13 are of the substantially parallelopiped and rigid and have a flat reference surface 11A or 13A on the side opposite to the resilient projections 12 or 14. The reference surfaces 11A and 13A extend in planes perpendicular to each other. The resilient projection 12 or 14 has an elastic hook 12A or 14A so that when the resilient projection 12 and 14 are inserted into the rectangular apertures 7 and 8, the elastic hooks 12A and 14A are pressed against surfaces opposed to the reference surfaces 7A and 8A and undergo elastic deformation while the reference surfaces 11A and 13A of the column projections 11 and 13 are pressed against the reference surfaces 7A and 8A of the rectangular apertures 7 and 8, respectively.

Figure 4:
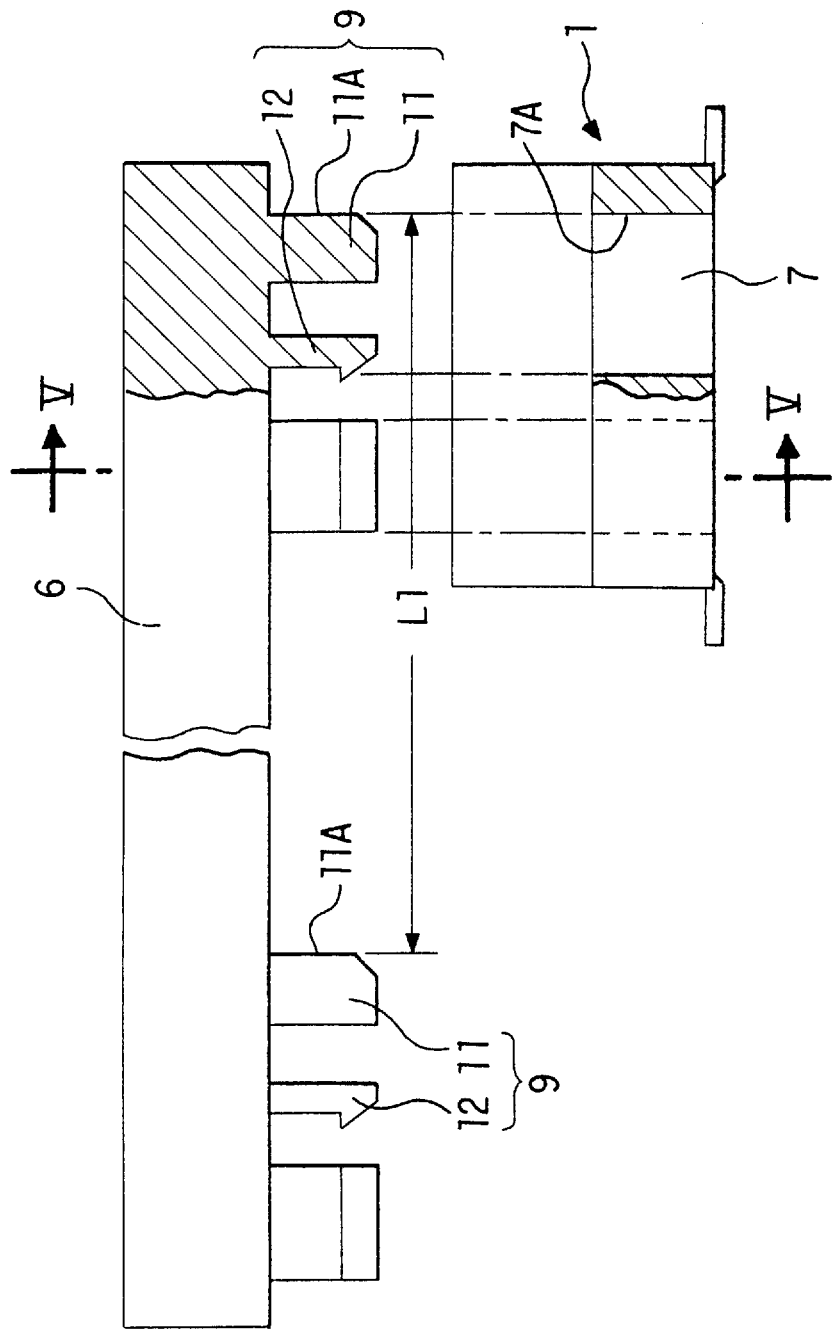
FIG. 4 is a partially cutaway front elevational view of the connector and the linking member.

In FIG. 4, it is preferred that the reference surfaces 11A of the column projections 11 on opposite ends of the linking member 6 are provided on the same side so that when the column projections 11 are pushed by the resilient projections 12 to the right, the two connectors 1 are positioned with a predetermined interval L1 by the reference surfaces 11A.

Figure 5:
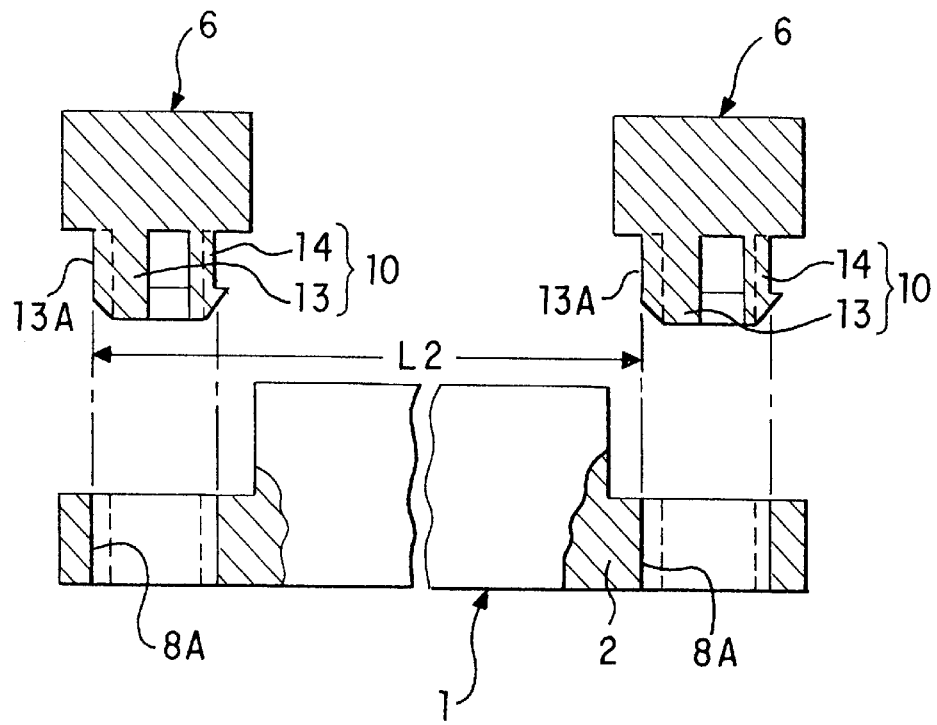
FIG. 5 is a sectional view taken along line V—V of FIG. 4.

In FIG. 5, it is also preferred that the reference surfaces 13A of the column projections 13 of two linking members 6 are provided on the same side so that the two linking members 6 are positioned with a predetermined interval L2 provided in the elongated housing 2.

It is preferred that the resilient hooks 12 and 14 are made of a material that changes from elastic deformation to plastic deformation under heating after they are inserted in the rectangular apertures 7 and 8.

How to use the electrical connector according to the invention will be described below with reference to the accompanying drawing including FIG. 6.

(1) As shown in FIG. 1, two female type multicontact connectors 1 and two linking members 6 are provided.

(2) As shown in FIGS. 3–5 and 6(A), the projection members 9 and 10 of the linking members 6 are placed above the rectangular apertures 7 and 8 of the elongated housings 2.

Figure 6A:
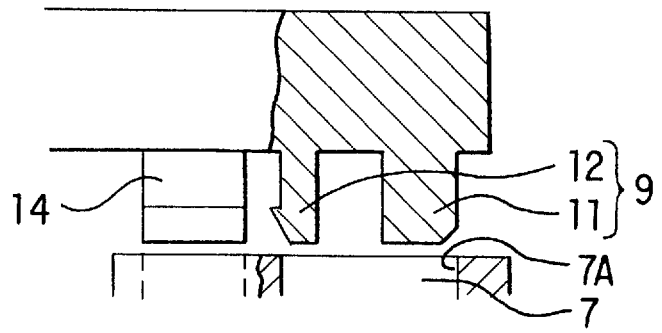
FIG. 6 shows a process of linking the connectors.
Figure 6B:
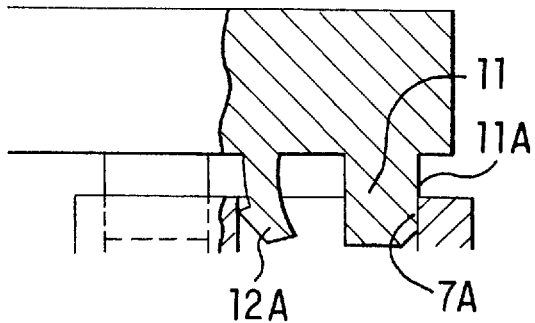
Figure 6C:
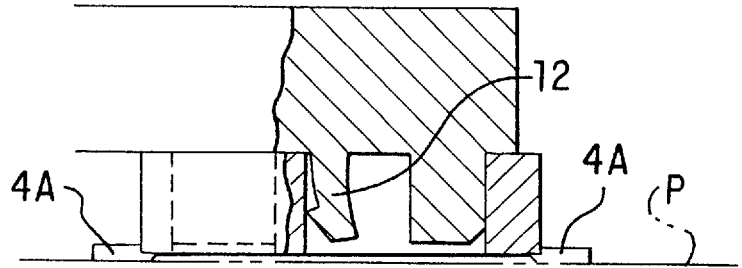

(3) As shown in FIGS. 6(B) to 6(C), the projection member 9 is pushed into the rectangular aperture 7 so that the resilient hook 12A receives a reactionary force by the surface of the rectangular aperture 7 and undergoes elastic deformation. (The projection member 10 has similar functions, and its description will be omitted.) The reference surface 11A of the column projection 11 is pressed against the reference surface 7A of the rectangular aperture 7 by the reactionary force so that the two connectors 1 are positioned with a predetermined interval by the reference surfaces 11A and 7A. Similarly, the two linking members 6 are positioned with a predetermined interval by the connectors 1.

(4) Thus, the two multicontact connectors 1 are linked with the accurate interval and placed on a circuit board P as shown in FIG. 6(C) such that the connection portions 4A of contact elements 4 are soldered to corresponding conductors by using the reflow technique. The two multicontact connectors 1 accurately positioned by the linking members 6 are fixed as they are by the soldering. The elastic deformation of the resilient hooks 12 becomes plastic under the soldering heat.

Figure 6D:
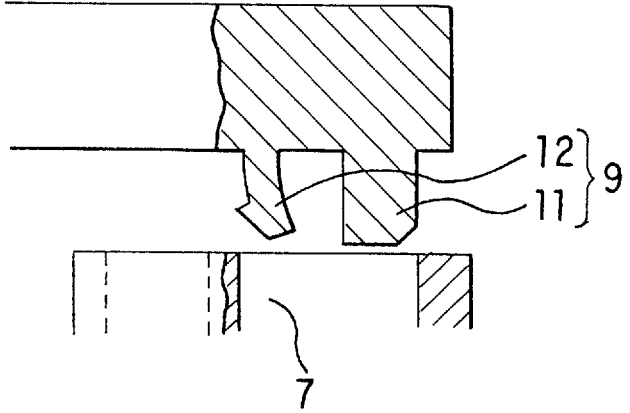

(5) Then, the linking members 6 are removed from the connectors 1. Since the resilient hooks 12 have been plastic and receive no or little reactionary force from the rectangular apertures 7, the projection members 9 are removed from the rectangular apertures 7 without difficulty as shown in FIG. 6(D).

Figure 7:
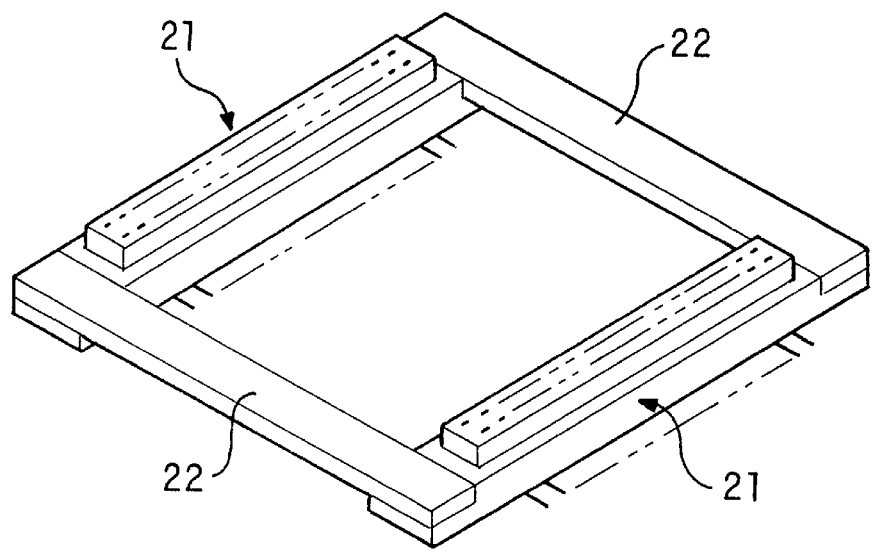
FIG. 7 is a perspective view of a mating connector.

(6) In FIG. 7, similarly, two male connectors 21 to be connected to the female connectors 1 are fixed at a predetermined position on another circuit board by using linking members 22.

Figure 8:
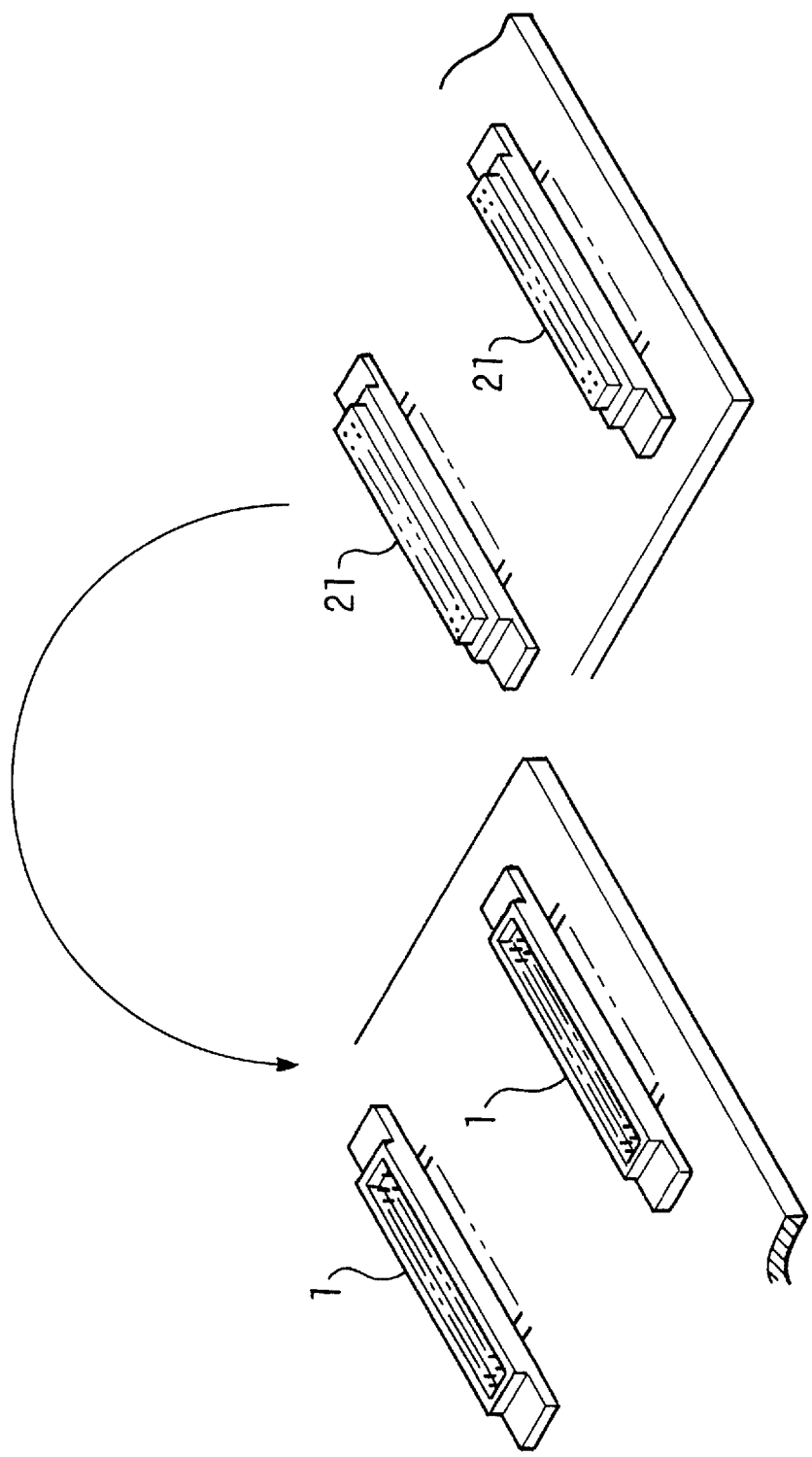
FIG. 8 is a perspective view of the mating connectors to be plugged into the connectors of FIG. 1.

(7) In FIG. 8, the male multicontact connectors 21 are plugged into the female multicontact connectors 1 so that the two circuit boards are connected to each other.

The linking members 22 are identical with the linking members 6 so that the costs of making metal molds are reduced. Since the both linking members are identical, the female and male connectors are positioned very accurately with respect to each other.

Figure 9:
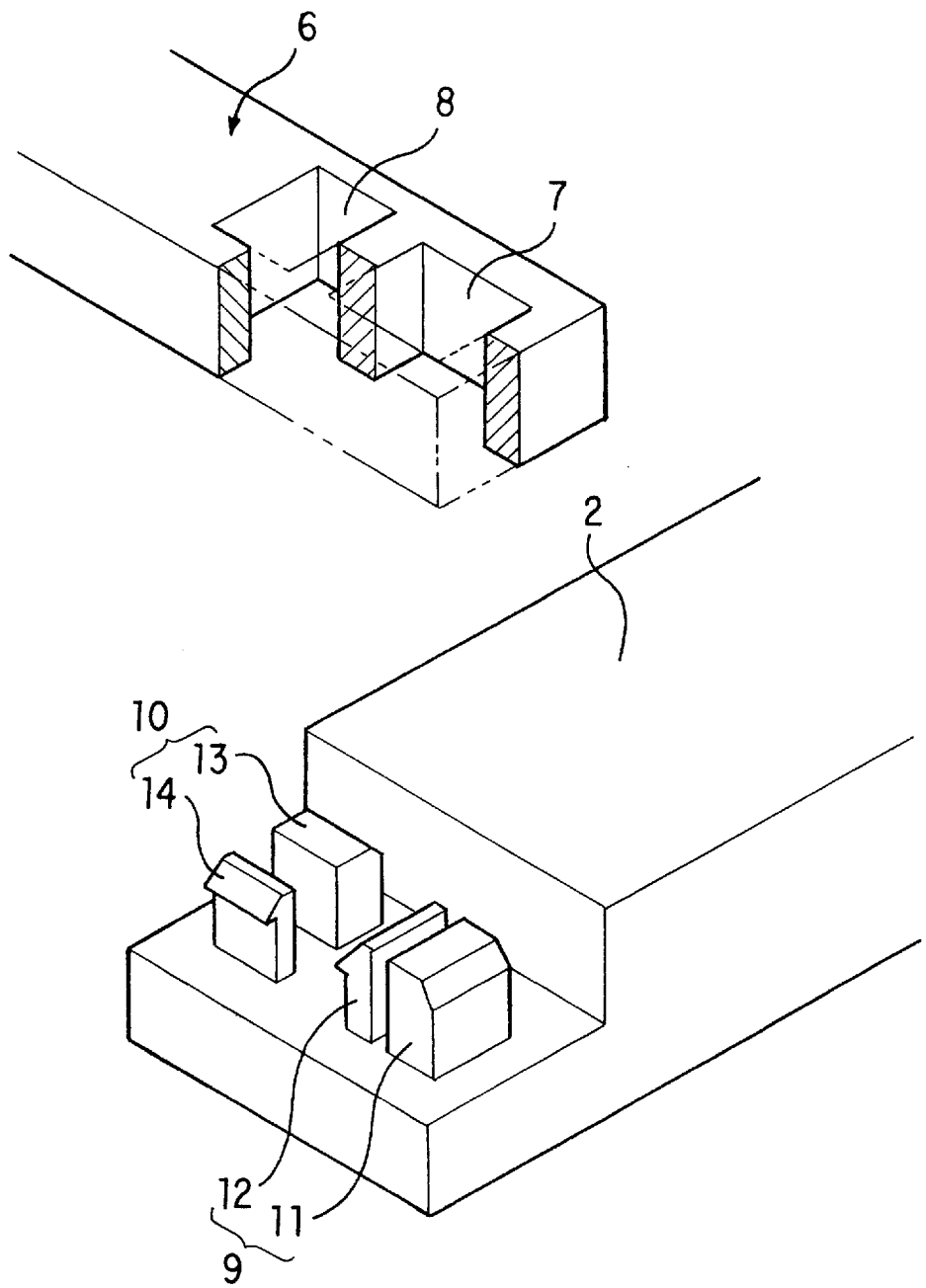
FIG. 9 is a partially cutaway perspective view of a linking portion of a connector according to another embodiment of the invention.

Alternatively, the rectangular apertures 7 and 8 and the projection members 9 and 10 are provided on the linking members 6 and the housing 2, respectively, as shown in FIG. 9.

Figure 10:
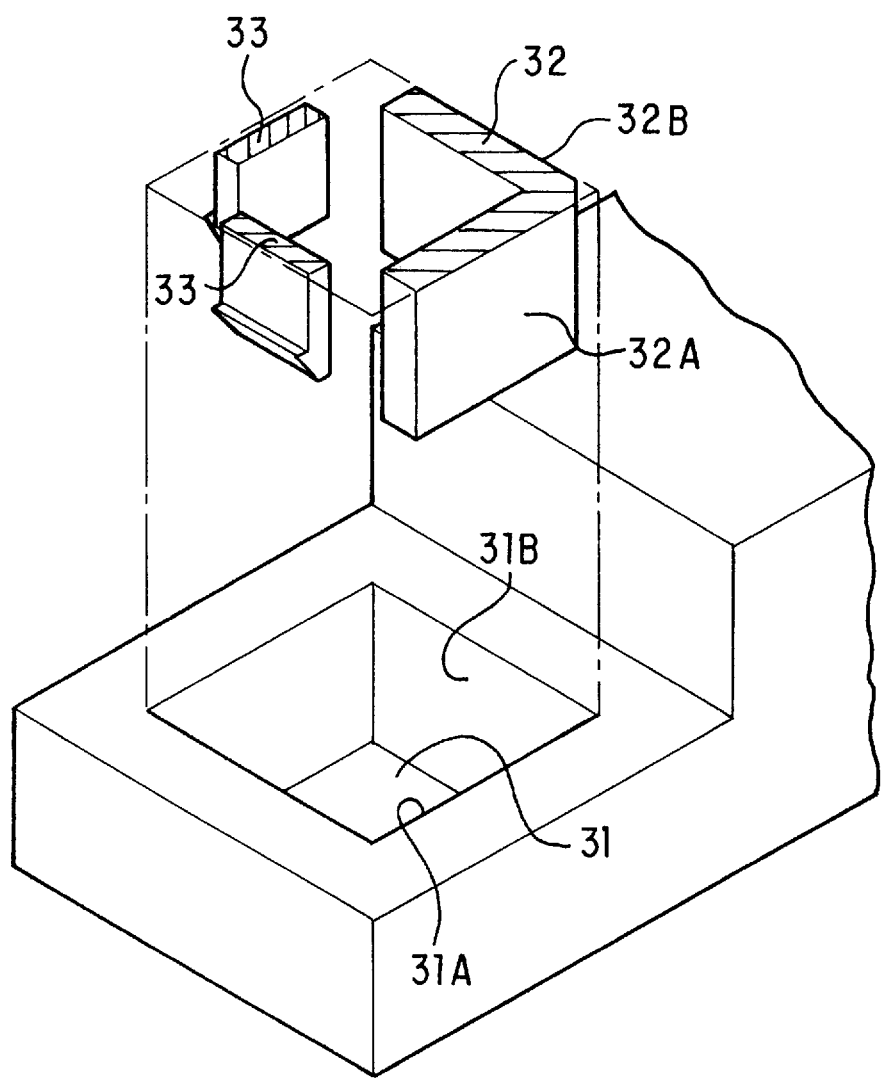
FIG. 10 is a partially cutaway perspective view of a linking portion of a connector according to still another embodiment of the invention.

Alternatively, reference surfaces 31A and 31B are provided on two planes of a single rectangular aperture 31 that are perpendicular to each other as shown in FIG. 10. Reference surfaces 32A and 32B are provided on two planes of a single L-shaped column projection 32 that are perpendicular to each other. It is necessary to provide two resilient projections 33 positioned at right angles to each other.

Figure 11:
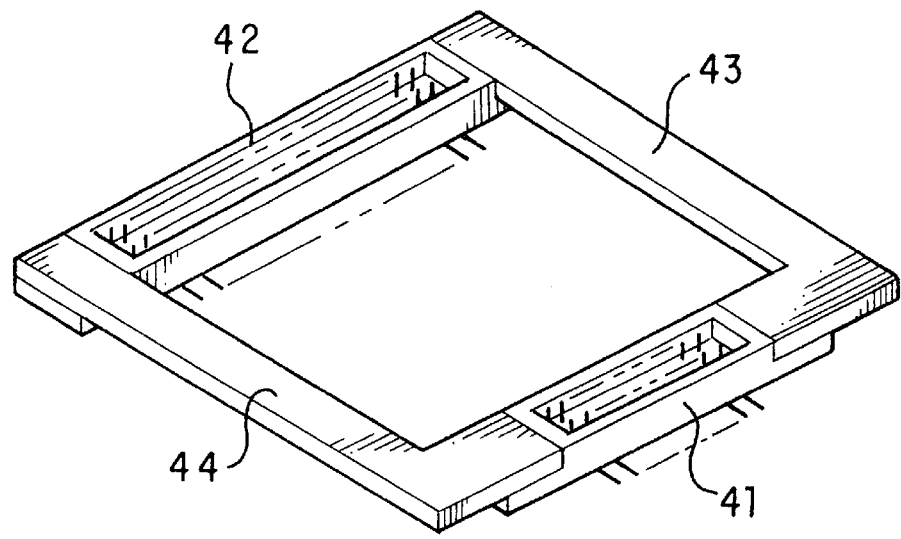
FIG. 11 is a perspective view of connectors joined according to yet another embodiment of the invention.

In FIG. 11, L-shaped linking members 43 and 44 are provided to join two multicontact connectors 41 and 42 that have different numbers of contact elements. It is necessary to make only the linking members, thus reducing the total costs for the metal molds.

Figure 12:
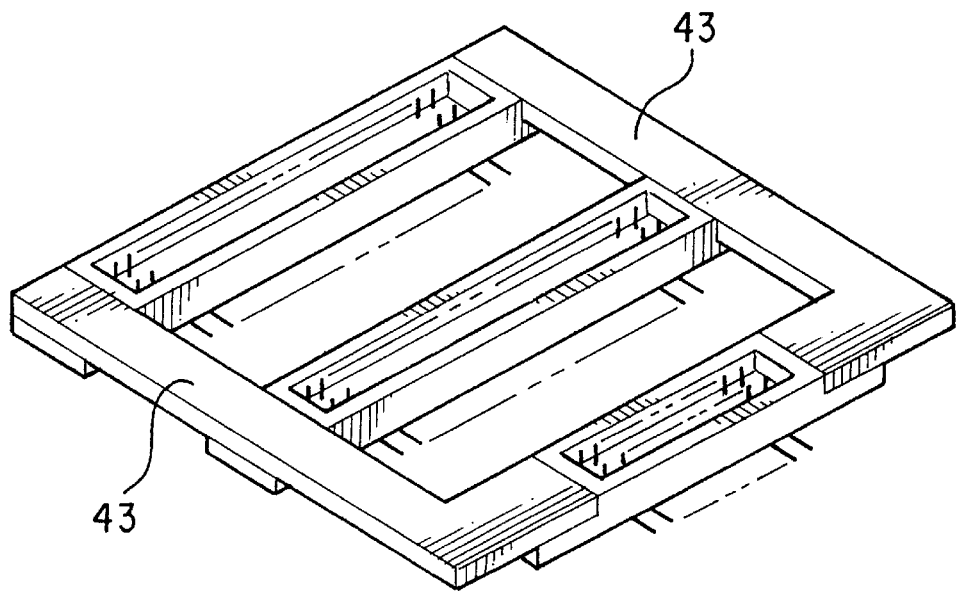
FIG. 12 is a perspective view of connectors joined according to another embodiment of the invention.
Figure 13:
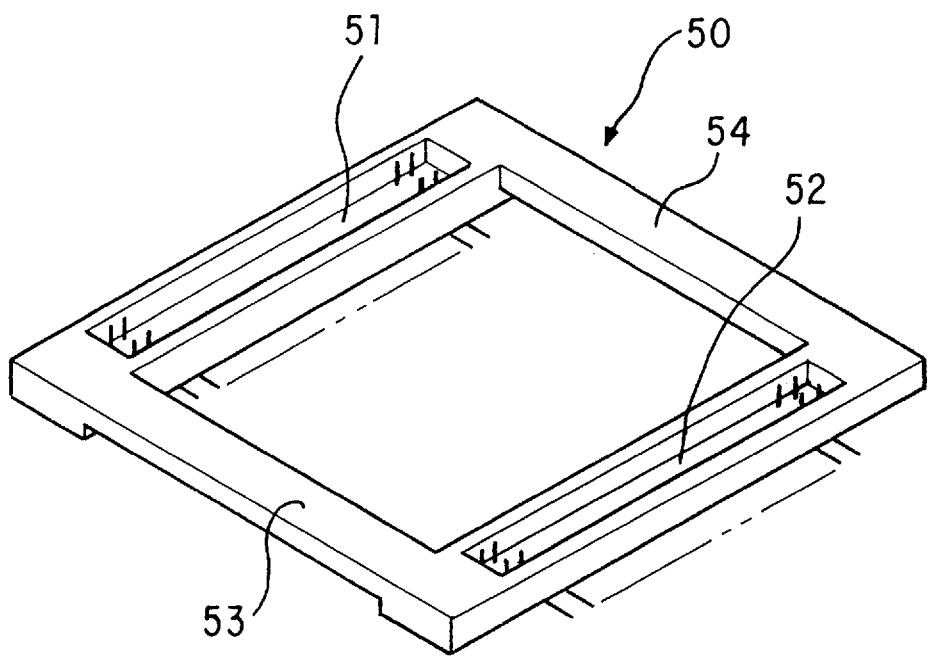
FIG. 13 is a perspective view of a conventional circuit board electrical connector.

In FIG. 12, projection members or rectangular apertures are provided also on the middle of the L-shaped linking members 43 so that three connectors having rectangular apertures or projecting members fitted over the projection members or rectangular apertures can be disposed simultaneously at predetermined positions on a circuit board. These linking members are also useful for joining only two multicontact connectors. If a number of projection members or rectangular apertures are provided at appropriate positions on a linking member, then the interval between connectors joined can be changed by selecting the appropriate projection members or rectangular apertures.

According to the invention, the linking members joining a number of multicontact connectors are removable from the connectors after the connectors are fixed to circuit boards so that the board space is usable for other electronic components thereby maximizing the mounting density. In addition, it is necessary to change only the linking members for other types of multicontact connectors so that the manufacturing costs can be minimized.

What is claimed is:

1. A circuit board electrical connector comprising:

a plurality of multicontact connectors to be mounted on a circuit board with a predetermined interval;

a plurality of linking members for joining said multicontact connectors with said predetermined interval before said multicontact connectors are mounted on said circuit board; and linking means for removably linking said multicontact connectors to said linking members, wherein said multicontact connectors comprises an elongated housing and said linking means comprises at least one rectangular aperture provided in either said elongated housing or said linking member and at least one projection member provided on either said linking member or said elongated housing for fitting in said rectangular aperture.

2. A circuit board electrical connector according to claim 1, wherein said projection member comprises a rigid column projection and a resilient projection, a first surface of said column projection and a second surface of said rectangular aperture that is parallel to said first surface constituting reference surfaces at right angles, and said resilient projection being flexible to exert pressures on said reference surfaces.

3. A circuit board electrical connector according to claim 2, wherein there are provided two pairs of said projection members with reference surfaces at right angles to each other.

4. A circuit board electrical connector according to claim 2, wherein said resilient projection undergoes plastic deformation under heat.

5. A circuit board electrical connector according to claim 1, wherein said linking means comprises at least one reference surface to position said multicontact connectors with said predetermined interval.

6. A circuit board electrical connector comprising:

a plurality of multicontact connectors to be mounted on a circuit board with a predetermined interval;

a plurality of linking members for joining said multicontact connectors with said predetermined interval before said multicontact connectors are mounted on said circuit board; and linking means for removably linking said multicontact connectors to said linking members, wherein said multicontact connectors have an elongated housing which has a pair of stepped portion at opposite ends to which said linking members are connected with said linking means and said linking members have a thickness such that said joined linking members do not exceed the highest level of said elongated housing.

* * * * *